(12) United States Patent
Sato et al.

(10) Patent No.: US 11,690,299 B2
(45) Date of Patent: Jun. 27, 2023

(54) MAGNETORESISTANCE EFFECT ELEMENT AND MAGNETIC MEMORY

(71) Applicant: Tohoku University, Miyagi (JP)

(72) Inventors: Hideo Sato, Miyagi (JP); Shinya Ishikawa, Miyagi (JP); Shunsuke Fukami, Miyagi (JP); Hideo Ohno, Miyagi (JP); Tetsuo Endoh, Miyagi (JP)

(73) Assignee: Tohoku University, Miyagi (JP)

( * ) Notice: Subject to any disclaimer, the term of this patent is extended or adjusted under 35 U.S.C. 154(b) by 0 days.

(21) Appl. No.: 16/768,564

(22) PCT Filed: Dec. 14, 2018

(86) PCT No.: PCT/JP2018/046036
§ 371 (c)(1),
(2) Date: Sep. 21, 2020

(87) PCT Pub. No.: WO2019/138778
PCT Pub. Date: Jul. 18, 2019

(65) Prior Publication Data
US 2021/0005808 A1 Jan. 7, 2021

(30) Foreign Application Priority Data

Jan. 10, 2018 (JP) .............................. JP2018-002111

(51) Int. Cl.
*H10N 52/80* (2023.01)
*H10B 61/00* (2023.01)
(Continued)

(52) U.S. Cl.
CPC ............. *H10N 52/80* (2023.02); *H10B 61/22* (2023.02); *H10N 50/85* (2023.02); *H10N 52/00* (2023.02)

(58) Field of Classification Search
CPC ....... H01L 43/04; H01L 27/228; H01L 43/06; H01L 43/10; H01L 52/80; H01L 50/85; H01L 52/00; H10B 61/22
See application file for complete search history.

(56) References Cited

U.S. PATENT DOCUMENTS

| 9,275,660 B1* | 3/2016 | Isowaki | ............... G11B 5/3912 |
| 2004/0100855 A1* | 5/2004 | Saito | ....................... G11C 11/16 257/E27.005 |

(Continued)

FOREIGN PATENT DOCUMENTS

| JP | 2013541219 A | 11/2013 |
| JP | 2017-59690 A | 3/2017 |

(Continued)

OTHER PUBLICATIONS

Miron, I. M., et al., Perpendicular Switching of a Single Ferromagnetic Layer Induced by In-Plane Current Injection, Nature, 2011, 476, pp. 189-193.

(Continued)

*Primary Examiner* — Latanya N Crawford Eason
(74) *Attorney, Agent, or Firm* — Procopio, Cory, Hargreaves & Savitch LLP

(57) ABSTRACT

Provided is an X-type 3-terminal STT-MRAM (spin orbital torque magnetization reversal component) having a high thermal stability index Δ and a low writing current $I_C$ in a balanced manner. A magnetoresistance effect element has a configuration of channel layer (1)/barrier layer non adjacent magnetic layer (2b)/barrier layer adjacent magnetic layer (2a)/barrier layer (3).

9 Claims, 19 Drawing Sheets

(51) Int. Cl.
*H10N 50/85* (2023.01)
*H10N 52/00* (2023.01)

(56) References Cited

U.S. PATENT DOCUMENTS

| | | | |
|---|---|---|---|
| 2012/0098077 | A1 | 4/2012 | Gaudin et al. |
| 2014/0269036 | A1* | 9/2014 | Pi .................... G11C 11/161 |
| | | | 365/158 |
| 2014/0312441 | A1 | 10/2014 | Guo |
| 2015/0091110 | A1 | 4/2015 | Kuo et al. |
| 2017/0077177 | A1 | 3/2017 | Shimomura et al. |
| 2017/0077394 | A1 | 3/2017 | Saida |
| 2017/0222135 | A1* | 8/2017 | Fukami .............. G11C 11/1675 |
| 2017/0330070 | A1* | 11/2017 | Sengupta .............. H01L 43/08 |
| 2018/0219152 | A1* | 8/2018 | Apalkov .............. H01L 43/10 |
| 2018/0366172 | A1* | 12/2018 | Wang .................... H01L 27/222 |
| 2019/0165254 | A1* | 5/2019 | Lee .................... G11C 11/18 |

FOREIGN PATENT DOCUMENTS

| | | |
|---|---|---|
| JP | 2017059679 A | 3/2017 |
| JP | 2018026481 A | 2/2018 |
| KR | 20160064073 A | 6/2016 |
| KR | 20170040334 A | 4/2017 |
| WO | 2016021468 A1 | 2/2016 |

OTHER PUBLICATIONS

Liu, L., et al., Spin-Torque Switching with the Giant Spin Hall Effect of Tantalum, Science, 2012, 336, pp. 555-558.
Fukami, S., et al., A Spin-Orbit Torque Switching Scheme with Collinear Magnetic Easy Axis and Current Configuration, Nature Nanotechnology, 2016, 11, pp. 621-625.
Takikawa, M, et al., In-Plane Current-Induced Magnetization Switching in CoGa/MnGa/MgO Films, Applied Physics Express, 2017, 073004, 4 pgs.
Written Opinion for related PCT App No. PCT/JP2018/046036 dated Feb. 19, 2019, 11 pgs.
Internal Search Report for related PCT App No. PCT/JP2018/046036 dated Feb. 26, 2019, 11 pgs. (partial translation).
Japanese Patent Office, Notice of Reasons for Refusal, Application No. 2019-564353, dated Jan. 10, 2023, in 8 pages.
Korean Patent Office, Request for the Submission of an Opinion, Application No. 10-2020-7021142, dated Oct. 21, 2022, in 11 pages.

* cited by examiner

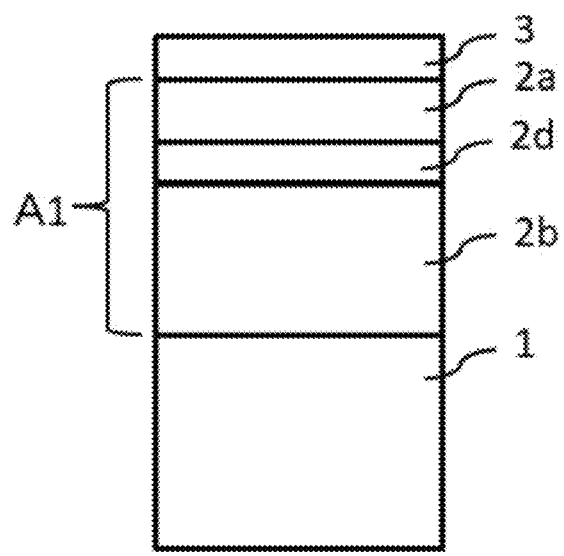
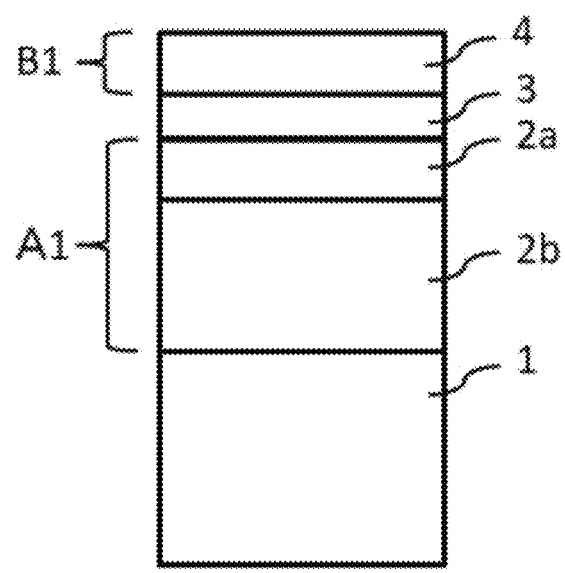

Fig. 7
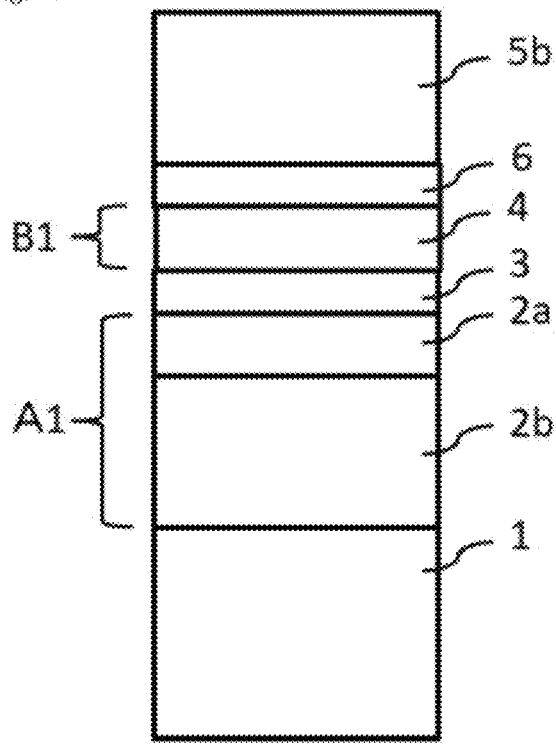
Fig. 8A
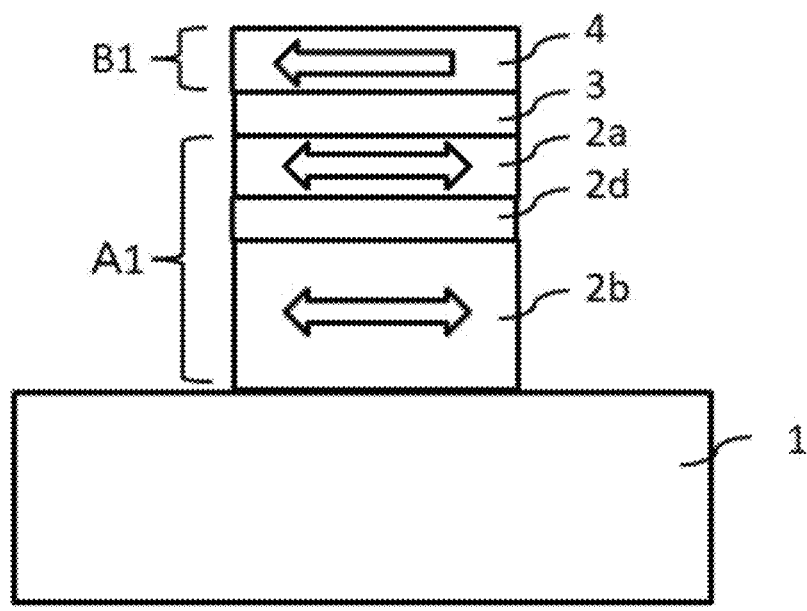

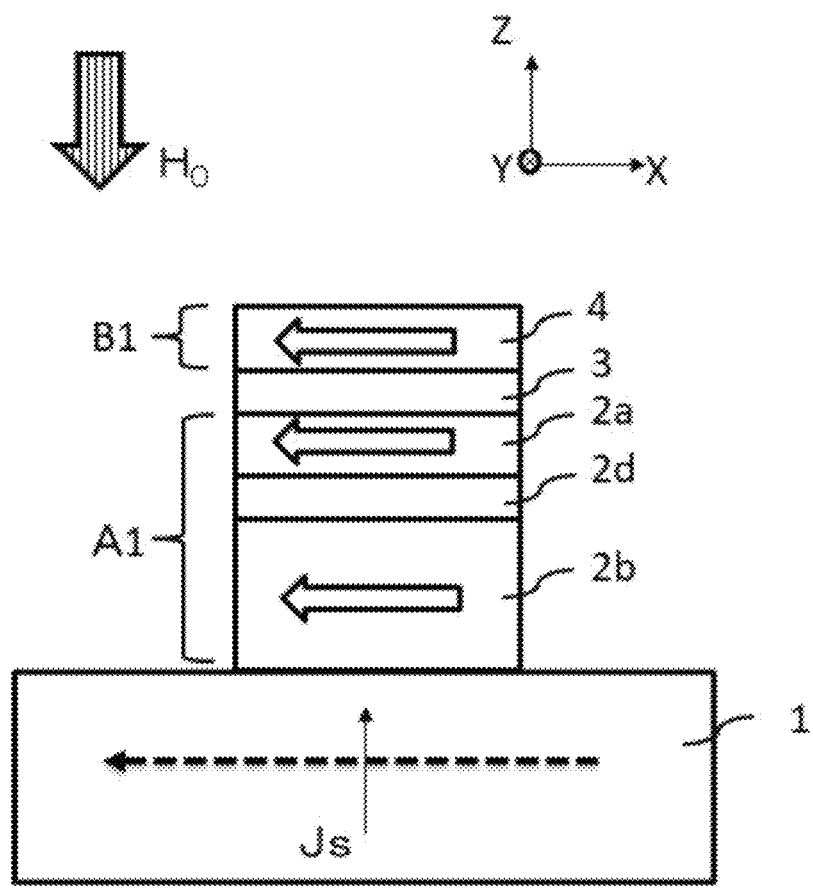

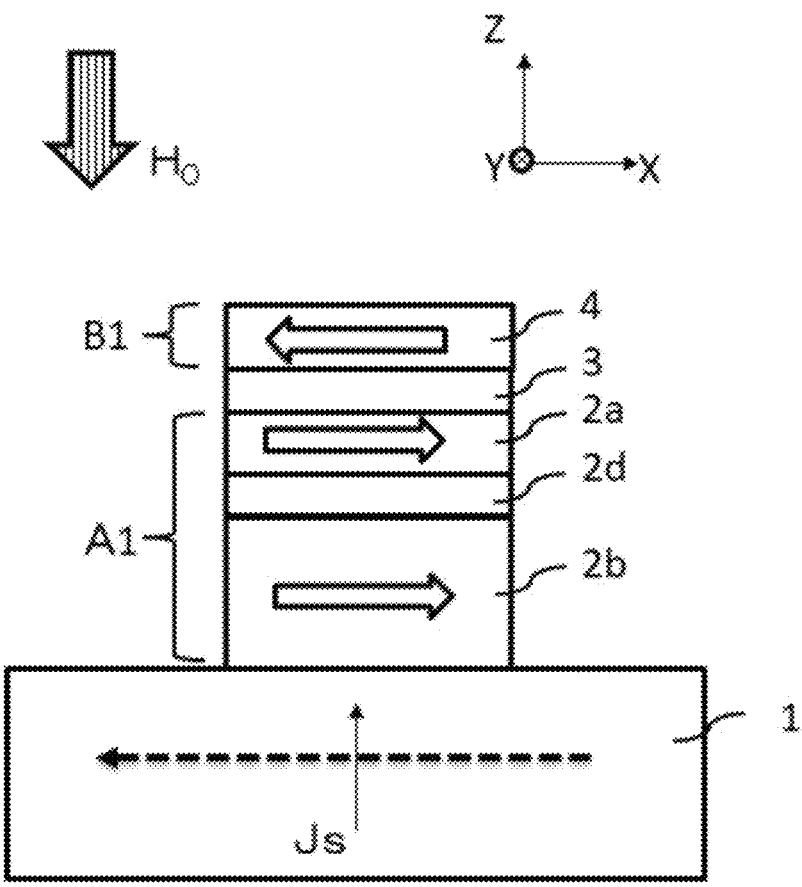

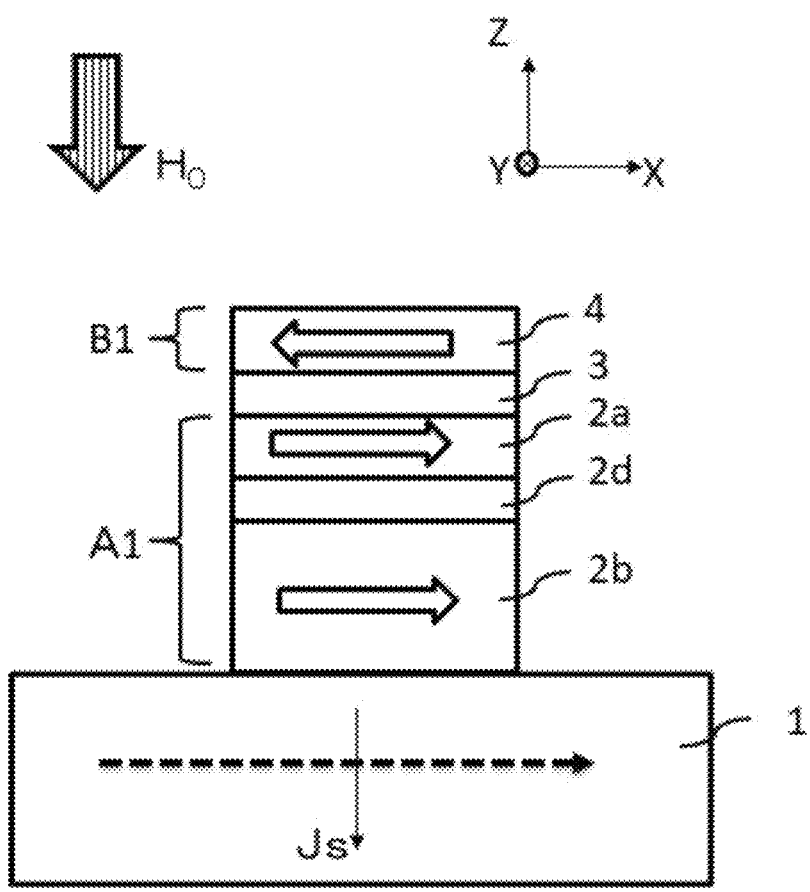

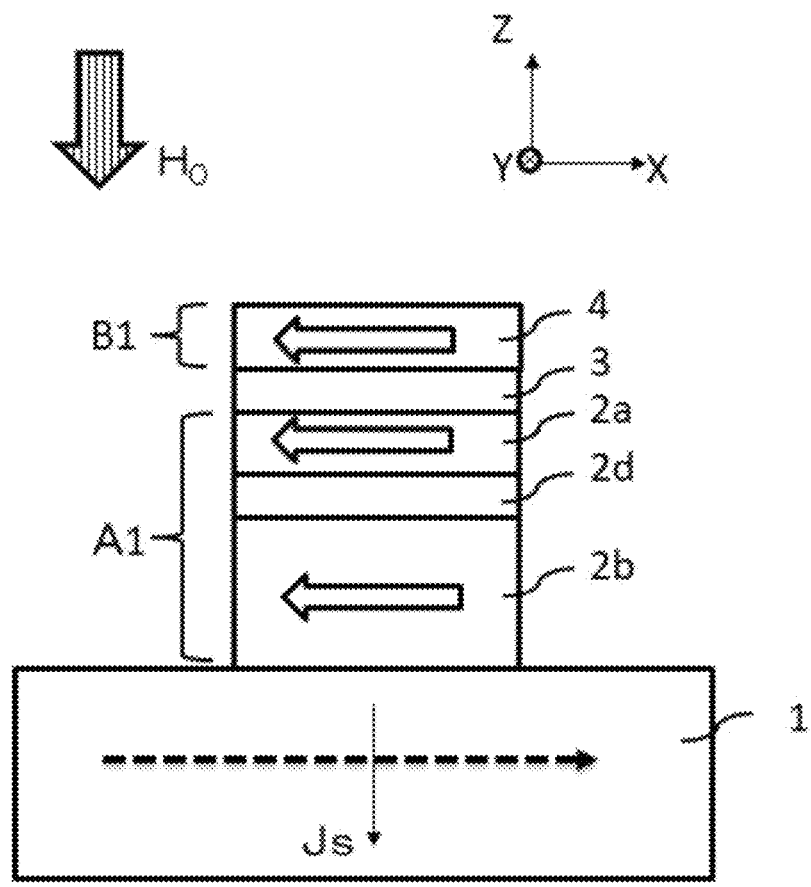

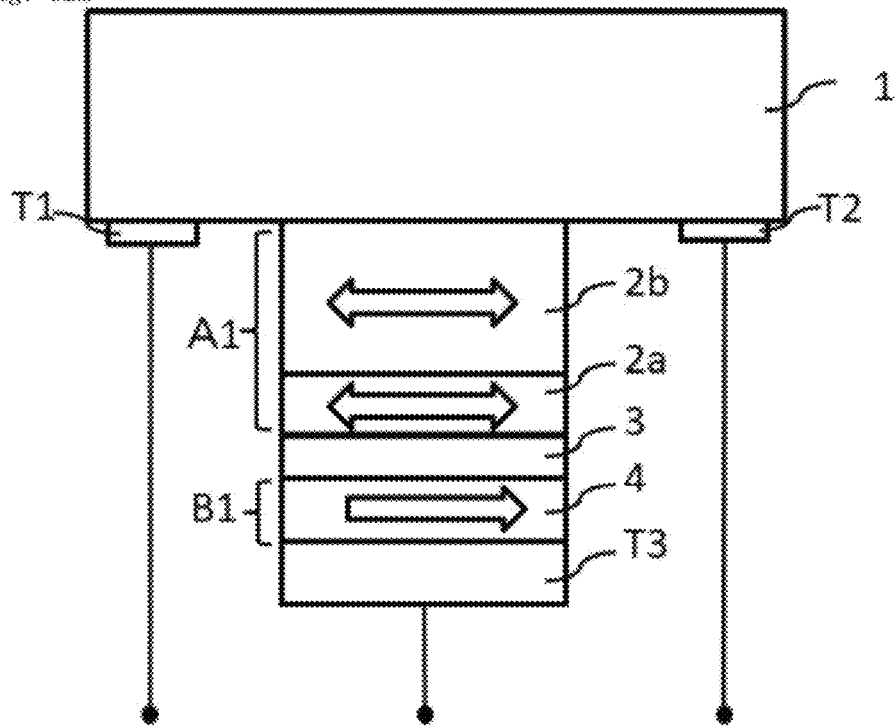
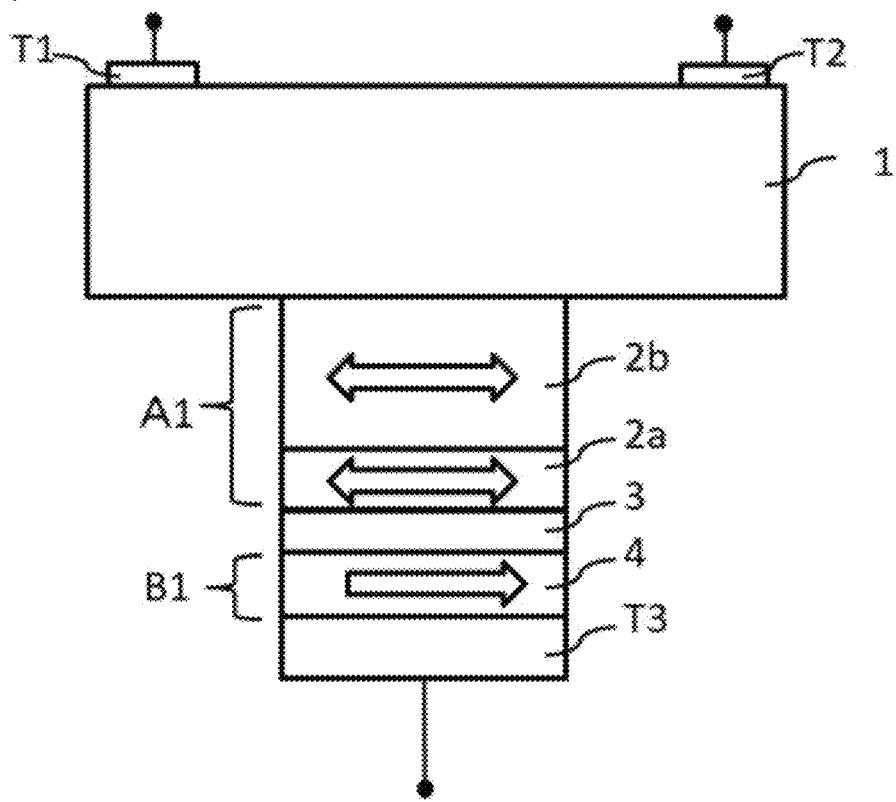

Fig.14
Fig.14(a) CONVENTIONAL EXAMPLE
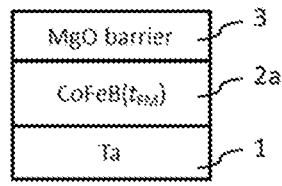
Fig.14(b) EMBODIMENT 14
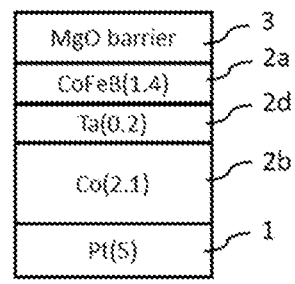
Fig.14(c)
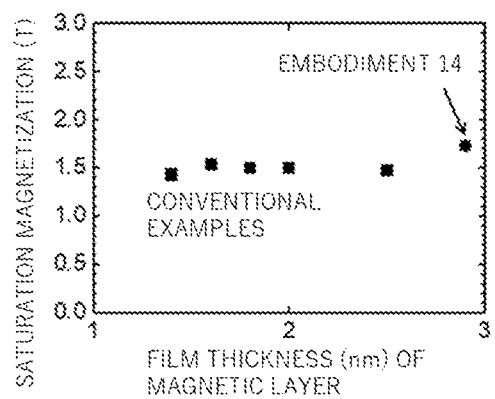
Fig.14(d)
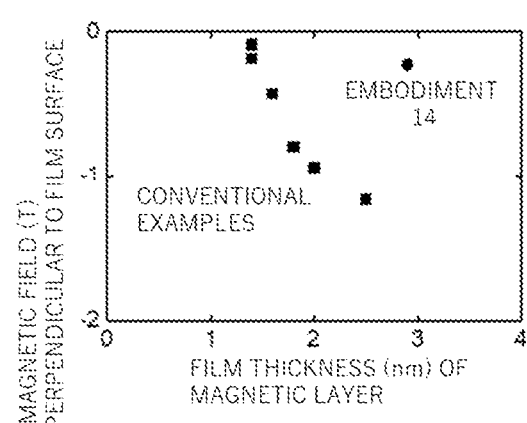

MAGNETORESISTANCE EFFECT ELEMENT AND MAGNETIC MEMORY

CROSS-REFERENCE TO RELATED APPLICATIONS

This application is a U.S. National Stage entry of PCT Application No: PCT/JP2018/046036 filed Dec. 14, 2018, which claims priority to Japanese Patent Application No. 2018-002111 filed Jan. 10, 2018, the contents of which are incorporated herein by reference.

TECHNICAL FIELD

The present invention relates to a magnetoresistance effect element, and a magnetic memory including the magnetoresistance effect element. More particularly, it relates to a spin orbital torque magnetization reversal component.

BACKGROUND ART

A MRAM (Magnetic Random Access Memory; magnetic memory) is a nonvolatile memory using MTJ (Magnetic Tunnel Junction).

A MRAM not consuming electric power when on standby, and having high-speed performance and high write endurance, and capable of being miniaturized to 10 nm or less has received attention as a next-generation logic integrated circuit.

The bit information recorded on the magnetic layer (recording layer) of a MRAM is read out through a barrier layer using the TMR (Tunnel Magnetoresistance) effect.

Meanwhile, examples of the methods of writing to the magnetic layer (recording layer) include methods using magnetic fields, and methods using current. The MRAM using the latter writing method comes in a 2-terminal type in which bit information is written to a magnetic layer (recording layer) using a spin transfer torque, and a 3-terminal type in which bit information is written to a magnetic layer (recording layer) using Spin-orbit-torque (SOT) induced magnetization reversal, or the like. As compared with the 2-terminal STT-MRAM, the 3-terminal STT-MRAM (spin orbital torque magnetization reversal component, also referred to as a SOT component) in which the paths for the writing current and the reading current are different can ensure a wide voltage operation margin. For this reason, the 3-terminal STT-MRAM is known to be more suitable for a memory required to operate at a particularly high speed.

The SOT component has a structure in which magnetic tunnel junction is formed on a channel layer formed of a heavy metal or the like formed in a wire shape, and performs writing of information by passing a current through the channel layer, and thereby making the magnetization of the recording layer at the magnetic tunnel junction reversal. For read out, a reading current is passed through the magnetic tunnel junction from one side of the channel layer.

Further, the 3-terminal MRAM using SOT comes in a Z type, a Y type, and an X type according to the direction of the axis of easy magnetization.

For the 3-terminal MRAM of the Z type, the magnetization points to the substrate perpendicular direction (Z axial direction), and the operation was demonstrated in the year 2011 (see NPL 1, and the like). The Z type is in principle capable of magnetization reversal (writing) with a current as low as that in the low-speed region even in the high-speed region in the vicinity of nanoseconds. Nevertheless, the Z type is disadvantageous in that an external magnetic field is required for causing magnetization reversal.

For the 3-terminal MRAM of the Y type, the magnetization points to the direction (Y axial direction) orthogonal to the current within the substrate plane, and the operation was demonstrated in the year 2012 (see PTL 2, and the like). The Y type has a problem of a remarkable increase in current required for magnetization reversal in the high-speed region, and a problem of an increase in cell area. Nevertheless, magnetization can be made reversal with a small current in the low-speed region.

For the 3-terminal STT-MRAM of the X type, the magnetization points to the direction (X axial direction) in parallel with the current, and the operation was demonstrated in the year 2014 (see NPL 3, PTL 1, and the like). The X type can implement high-speed magnetization reversal at a 1-nanosecond level with a low current.

CITATION LIST

Non Patent Literature

[NPL 1] Ioan Mihai Miron et. al., "Perpendicular switching of a single ferromagnetic layer induced by in-plane current injection", Nature 476, 189-193 (2011)

[NPL 2] Luqiao Liu et. al., "Spin-Torque Switching with the Giant Spin Hall Effect of Tantalum", Science 336, 555-558 (2012)

[NPL 3] S. Fukami, et. al., "A spin-orbit torque switching scheme with collinear magnetic easy axis and current configuration", Nature Nanotechnology 11, 621-625 (2016)

[NPL 4] M. Takikawa et al., "In-plane current-induced magnetization switching in CoGa/MnGa/MgO films" Applied Physics Express, 10, 073004 (2017).

Patent Literatures

[PTL 1] WO 2016/021468
[PTL 2] Japanese Translation of PCT Application No. 2013-541219

SUMMARY OF INVENTION

Technical Problem

Incidentally, the characteristics that matter in application for the MRAM of a magnetoresistance effect element are (i) large thermal stability index $\Delta$, (ii) small writing current $I_C$, (iii) large tunnel magnetoresistance ratio (TMR ratio) of the magnetoresistance effect element, and (iv) small component size. The (i) is the characteristic required for the nonvolatility of the magnetic memory, (ii) for responding to writing at a high speed, and reducing the power consumption, (iii) for responding to readout at a high speed, and (iv) for reducing the cell area, and implementing a larger capacity.

For the 3-terminal STT-MRAM of the X type disclosed in PTL 1, as compared with the conventional Z type and Y type, progress has been more made in improvement of the characteristics of (ii) and (iii), which enables a low current operation and a high speed operation. Nevertheless, a further improvement is demanded for the characteristic of the thermal stability index $\Delta$ of (i). When CoFeB/MgO shown in PTL 2 and NPL 3 is used, it is effective to increase the CoFeB film thickness of the magnetic layer without increasing the area of the cell for increasing the thermal stability index $\Delta$. However, undesirably, when the CoFeB film thickness is increased for increasing the thermal stability index $\Delta$, the absolute value of the effective diamagnetic field $H_k^{eff}$ in the direction perpendicular to a film surface, resulting in an increase in writing current $I_C$.

In view of the foregoing circumstances, the present invention has found and completed a 3-terminal STT-MRAM (spin orbital torque magnetization reversal component) combining both characteristics of a high thermal stability index $\Delta$ and a low writing current $I_C$.

Solution to Problem

In order to solve the problem, a magnetoresistance effect element of the present invention includes: a channel layer, a recording layer disposed adjacent to the channel layer, and including a ferromagnetic substance, and a barrier layer disposed adjacent to the recording layer on the opposite side thereof to the channel layer, and including an insulator. The recording layer has at least two or more magnetic layers including films having different magnetic characteristics, the two or more magnetic layers include one barrier layer adjacent magnetic layer disposed adjacent to the barrier layer, and one or more barrier layer non adjacent magnetic layers not adjacent to the barrier layer, a magnetization direction of the recording layer has a component in a direction of a current to be introduced to the channel layer, and is variable, and a current in a direction substantially in parallel with the recording layer is introduced to the channel layer, thereby reversing the magnetization direction of the recoding layer.

At least one more of the barrier layer non adjacent magnetic layers included in the recording layer desirably includes a magnetic material film having perpendicular magnetic anisotropy, and exhibiting an in-plane axis of easy magnetization.

Desirably, the barrier layer non adjacent magnetic layer is a film including at least Co, a laminated layer film including at least Co, or an alloy film including at least Co or Mn, and the laminated layer film has a laminated layer structure of two or more layers.

Desirably, the barrier layer adjacent magnetic layer includes at least Fe, and the barrier layer includes at least O.

A non-magnetic insertion layer may be inserted between the two or more magnetic layers forming the recording layer.

The channel layer may include a heavy metal.

A longitudinal effective field to be applied to the recording layer from a direction perpendicular to a film surface of the channel layer due to introduction of a current to the channel layer may make the magnetization direction of the recording layer reversal.

An axis of easy magnetization of the recording layer is desirably in a direction at within ±25° with respect to a direction of the current.

It is acceptable that the channel layer has a shape extended in the direction of the current to be introduced, that the recording layer has substantially a two-fold symmetric shape in a recording layer plane, and that the longitudinal direction has a component in the direction of the current.

A pulse width of the current to be introduced to the channel layer is desirably 0.3 to 10 nanoseconds.

Further, a magnetic memory of the present invention has the magnetoresistance effect element.

Advantageous Effects of Invention

The present invention can provide a magnetoresistance effect element and a magnetic memory, having a high thermal stability index $\Delta$, and capable of writing bit information with a low writing current $I_C$.

BRIEF DESCRIPTION OF DRAWINGS

FIG. 3 is a longitudinal section view showing a still other example of the configuration of the magnetoresistance effect element of the present invention.

FIG. 4 is a longitudinal section view showing a further example of the configuration of the magnetoresistance effect element of the present invention.

FIG. 7 is a longitudinal section view showing a still other example of the configuration of the magnetoresistance effect element of the present invention.

FIG. 8A is a front view showing an embodiment of the magnetoresistance effect element of the present invention.

FIG. 9A shows one example of a state before the magnetoresistance effect element of the present invention writes data "1".

FIG. 9B shows one example of a state after the magnetoresistance effect element of the present invention writes data "1".

FIG. 9C shows one example of a state before the magnetoresistance effect element of the present invention writes data "0".

FIG. 9D shows one example of a state after the magnetoresistance effect element of the present invention writes data "0".

FIG. 12B shows another example of a circuit configuration of a 1-bit memory cell using the magnetoresistance effect element of the present invention.

FIG. 12C shows a still other example of a circuit configuration of a 1-bit memory cell using the magnetoresistance effect element of the present invention.

FIG. 14 (a) is a view showing a configuration of a conventional example, (b) is a view showing a configuration of an example of the present invention, (c) is a graph showing the relationship between the total of the film thicknesses of the magnetic layers in the recording layer and the saturation magnetization, and (d) is a graph showing the relationship between the total of the film thicknesses of the magnetic layers in the recording layer and the effective diamagnetic field in the direction perpendicular to a film surface.

DESCRIPTION OF EMBODIMENTS

A magnetoresistance effect element and a magnetic memory of the present invention will be described in details below with reference to the accompanying drawings.

Note that each drawing is only an example, and is described with a reference number, which does not restrict the present invention at all.

Embodiment 1

Figure 1:
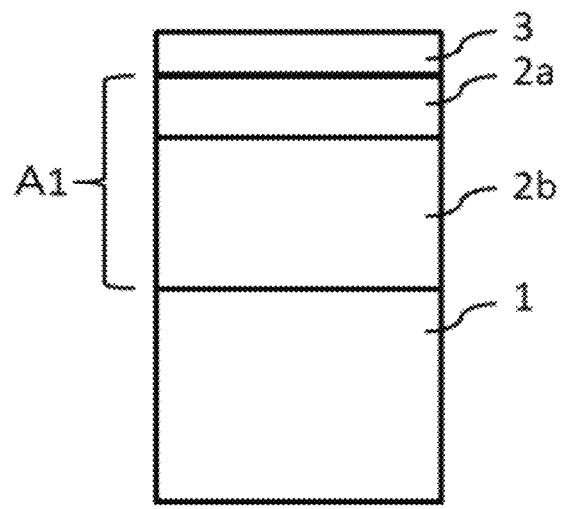
FIG. 1 is a longitudinal section view showing one example of a configuration of a magnetoresistance effect element of the present invention.

FIG. 1 shows a basic configuration of Embodiment 1 of the present invention. The basic configuration of the magnetoresistance effect element includes channel layer (1)/barrier layer non adjacent magnetic layer (2b)/barrier layer adjacent magnetic layer (2a)/barrier layer (3) sequentially arranged adjacent to one another therein. The barrier layer non adjacent magnetic layer (2b)/barrier layer adjacent magnetic layer (2a) constitutes a recording layer (A1).

The channel layer (1) may only be a material having a characteristic just to generate a spin current enough to reverse the recording layer at the magnetic tunnel junction, and especially desirably has a heavy metal. When a writing current $I_C$ is introduced to the channel layer, a spin current is generated. Accordingly, the magnetization direction of the adjacent recording layer (A1) is made reversal, so that writing to the magnetoresistance effect element is performed. For this reason, the channel layer (1) desirably includes a heavy metal having a large spin orbital interaction such as Ta, W, Hf, Re, Os, Ir, Pt, or Pd, or an alloy thereof. Alternatively, the material may be either a material obtained by appropriately adding a transition metal to the heavy metal layer, or a material obtained by doping a conductive material or the like with a heavy metal. Still alternatively, for the purpose of improving the electric material characteristics, or other purposes, B, C, N, O, Al, Si, P, Ga, Ge, or the like may be added. Further, Co—Ga described in NPL 4, or the like also becomes an option.

The shape of the channel layer (1) has no particular restriction so long as it allows passage of a writing current $I_C$ therethrough, and allows efficient magnetization reversal with respect to the recording layer (A1). A planar shape extended in the direction of the writing current $I_C$ is desirable. The current is introduced to the channel layer in the direction substantially in parallel with the recording layer. Assuming that the direction of the current is an X axis, the thickness of the channel layer is 0.5 nm to 20 nm, and preferably 1 nm to 10 nm, the length in the X axial direction is 60 nm to 260 nm, and preferably 100 nm to 150 nm, and the width in the Y axial direction is 20 nm to 150 nm, and preferably 60 nm to 120 nm.

The recording layer (A1) has at least two or more magnetic layers including films having different magnetic characteristics. The two or more magnetic layers include a barrier layer (3), one barrier layer adjacent magnetic layer (2a) that is disposed adjacent to the barrier layer (3), and one or more barrier layer non adjacent magnetic layers (2b) that is not adjacent to the barrier layer (3).

Herein, the films having different magnetic characteristics denote alloy films or laminated layer films having different various characteristics such as magnetic anisotropy and saturation magnetization. Generally, by changing the material, the composition, and the adjacent materials, it is possible to manufacture films having different magnetic characteristics with ease.

For the barrier layer adjacent magnetic layer (2a) that is adjacent to the barrier layer (3), it is desirable that a material including at least Fe is used in order to increase the TMR ratio. Specific examples thereof may include alloys such as Fe—B and Co—Fe—B. Further, for the purpose of improving the electric material characteristics, C, N, O, Al, Si, P, Ga, Ge, or the like may be added.

The film thickness of the barrier layer adjacent magnetic layer (2a) is appropriately adjusted so as to be able to absorb the film thickness variation in the wafer, and is typically 0.5 nm or more, and more preferably 1.4 nm or more.

Particularly, the film thickness of the barrier layer adjacent magnetic layer (2a) is adjusted as thin as possible within the range where the in-plane easy axis is exhibited in view of the film thickness variation within the wafer and the reduction of diamagnetic field coefficient in the direction perpendicular to a film surface upon processing into a component shape. When CoFeB is used for the barrier layer adjacent magnetic layer (2a), and MgO is used for the barrier layer (3), the film thickness is about 1.0 nm to 2.5 nm. The reason why the film thickness is adjusted as thin as possible within the range where the in-plane easy axis is exhibited is as follows: the absolute value of the effective anisotropic magnetic field in the perpendicular direction increases with an increase in film thickness, resulting in an increase in writing current.

The barrier layer non adjacent magnetic layer (2b) that is not adjacent to the barrier layer (3) preferably includes a magnetic material film having perpendicular magnetic anisotropy, and exhibiting an in-plane axis of easy magnetization. Here, the magnetic material film having perpendicular magnetic anisotropy, and exhibiting an in-plane axis of easy magnetization represents a material in which the magnetic field upon saturation of magnetization is smaller than the spontaneous magnetization when the magnetization is measured while making application of a magnetic field in the perpendicular direction.

Specific examples thereof may include a film including at least Co, a laminated layer film including at least Co, and an alloy film including at least Co or Mn. Mention may be made of a Co film, a Co/Pt laminated layer film, a Co/Pd laminated layer film, a Co/Ni laminated layer film, a CoPt alloy film, a CoPd alloy film, a CoNi alloy film and Mn type ordered alloys such as Mn—Al, Mn—Ga, and Mn—Ge. The laminated layer film has a laminated layer structure of two or more layers, and may only be a material which has perpendicular magnetic anisotropy, and can be adjusted so as to have an in-plane axis of easy magnetization according to the film thickness, the film formation conditions, the composition, and the like. For the Co film, the CoPt alloy film, the Co/Pt laminated layer film, the CoPd alloy film, the Co/Pd laminated layer film, the CoNi alloy film, the Co/Ni laminated layer film, and the like, the magnetic characteristics may be adjusted by appropriately adding another or more elements to each layer material, and the electric material characteristics, and the like may be improved by adding one or more elements such as B, C, N, O, Al, Si, P, Ga, and Ge.

Particularly, the film thickness of the barrier layer non adjacent magnetic layer (2b) is appropriately adjusted so as to prevent an increase in the absolute value of the effective diamagnetic field in the perpendicular direction when the interface magnetic anisotropy generated between the material of the channel layer (1) and the material of the barrier layer non adjacent magnetic layer (2b) is used. For example, Pt is used for the material of the channel layer (1), and Co is used for the barrier layer non adjacent magnetic layer (2b). In this case, when the Co film thickness is small (e.g., to 1 nm), a perpendicular easy axis is achieved by the perpendicular magnetic anisotropy at the interface with the material Pt of the channel layer (1). When the Co film thickness increases, the in-plane easy axis is achieved while imparting the perpendicular magnetic anisotropy. After achieving the in- plane easy axis, the film thickness is appropriately adjusted so as not to excessively increase the absolute value of the effective diamagnetic field. On the other hand, in each case of the Co/Pt laminated layer film, the Co/Pd laminated layer film, the Co/Ni laminated layer film, and the like, each laminated film has perpendicular magnetic anisotropy due to the interface anisotropy between Co and Pt, Pd, or Ni. The film thickness of each layer is appropriately adjusted so that the absolute value of the effective diamagnetic field in the perpendicular direction becomes constant, and the number of cycles of deposition for forming a laminated films is increased. The number of cycles of deposition for forming a laminated films may be appropriately adjusted so as to obtain a desirable thermal stability index Δ. Alternatively, in the case using a CoPt alloy film having bulk perpendicular magnetic anisotropy, or the like, the composition and the film formation conditions are appropriately adjusted so as to prevent the absolute value of the effective diamagnetic field in the perpendicular direction from becoming larger than that of the barrier layer adjacent magnetic layer (2a) in the in-plane magnetic film. Thus, the film thickness is appropriately adjusted so as to obtain a desirable thermal stability index Δ.

Further, when the size of the component is changed, the diamagnetic field coefficient in the perpendicular direction changes. For this reason, the film thicknesses, the compositions, and the film formation conditions of the barrier layer adjacent magnetic layer (2a) and the barrier layer non adjacent magnetic layer (2b) are appropriately adjusted.

As described up to this point, the film thickness of the barrier layer non adjacent magnetic layer (2b) is appropriately adjusted so as to obtain a desirable thermal stability index Δ. When the film thickness is increased with the effective diamagnetic field in the direction perpendicular to a film surface set constant, design is achieved so as to prevent the extreme increase in thermal stability index Δ. From such a viewpoint, in the case using a Co/Pt laminated layer film, a Co/Pd laminated layer film, a Co/Ni laminated layer film, a CoPd alloy film, or the like, the film thickness is typically 1 nm to 10 nm, and more preferably 1 nm to 6 nm. When the barrier layer non adjacent magnetic layer is added for making a laminated layer, the total of the film thicknesses is adjusted to typically 40 nm or less, and more preferably 24 nm or less. Further, in the case using a Mn type ordered alloy such as Mn—Al, Mn—Ga, or Mn—Ge illustrating less spontaneous oxidation, the film thickness of the barrier layer non adjacent magnetic layer (2b) is typically 90 nm or less, and more preferably 54 nm or less.

The barrier layer (3) includes at least O. Specific examples may include MgO, $Al_2O_3$, and AlN.

The film thickness of the barrier layer (3) is desirably 0.1 nm to 5 nm, and further 0.5 nm to 2 nm. When the film thickness is smaller than 0.1 nm, it becomes difficult to form continuous films in association with the atom size. On the contrary, when the film thickness is larger than 5 nm, the film formation time increases. For this reason, the length of time for manufacturing one wafer increases, resulting in a higher cost.

Incidentally, the recording layer (A1) is configured so as to have not only one magnetic layer but also at least two or more magnetic layers including films having different magnetic characteristics for the following reasons.

First, at the interface between the barrier layer adjacent magnetic layer (2a) and the barrier layer (3), the interface magnetic anisotropy is caused. For this reason, in order to decrease the writing current $I_C$ of the recording layer (A1) having the in-plane axis of easy magnetization, it is essential only that the absolute value of the effective diamagnetic field $H_K^{eff}$ in the direction perpendicular to a film surface is reduced by thinning the barrier layer adjacent magnetic layer (2a).

However, thinning of the barrier layer adjacent magnetic layer (2a) also causes a reduction of the thermal stability index Δ. In other words, with the configuration of only one magnetic layer adjacent to the barrier layer, the decrease in the writing current $I_C$ and the increase in thermal stability index Δ hold the relationship of tradeoff.

Thus, the barrier layer non adjacent magnetic layer (2b) constituted by a magnetic material film having perpendicular magnetic anisotropy and serving as the in-plane axis of easy magnetization is used to form a laminated layer between the barrier layer adjacent magnetic layer (2a) and the channel layer (1). As a result, without increasing the absolute value of the effective diamagnetic field $H_K^{eff}$ in the direction perpendicular to a film surface, the film thickness of the whole (overall) magnetic layers of the recording layer is increased, thereby increasing the thermal stability index Δ.

Note that, as the actual magnetoresistance effect element, the configuration is exemplified in which a reference layer is disposed adjacent to the barrier layer (3) on the opposite side thereof to the barrier layer adjacent magnetic layer (2a) in the basic configuration of Embodiment 1.

Embodiment 2

Figure 2:
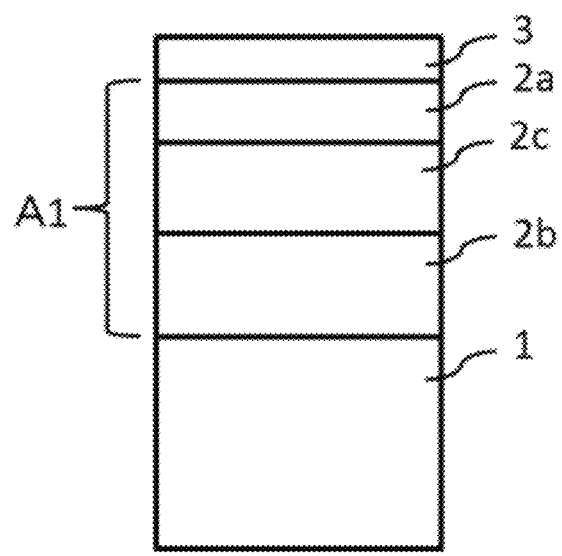
FIG. 2 is a longitudinal section view showing another example of the configuration of the magnetoresistance effect element of the present invention.

FIG. 2 shows a basic configuration of Embodiment 2 of the present invention. The configuration of the magnetoresistance effect element includes channel layer (1)/barrier layer non adjacent magnetic layer (2b)/additional barrier layer non adjacent magnetic layer (2c)/barrier layer adjacent magnetic layer (2a)/barrier layer (3) arranged sequentially adjacent to one another. The barrier layer non adjacent magnetic layer (2b)/additional barrier layer non adjacent magnetic layer (2c)/barrier layer adjacent magnetic layer (2a) constitute a recording layer (A1). The details of Embodiment 2 are the same as those of Embodiment 1 except for the following points.

The configuration and features of the additional barrier layer non adjacent magnetic layer (2c) are the same as those of the barrier layer non adjacent magnetic layer (2b). In order to increase the thermal stability index Δ by increasing the film thickness of the whole (overall) magnetic layers of the recording layer without increasing the absolute value of the effective diamagnetic field $H_k^{eff}$ in the direction perpendicular to a film surface, the additional barrier layer non adjacent magnetic layer (2c) is additionally inserted.

FIG. 2 shows an example in which two barrier layer non adjacent magnetic layers (2b and 2c) are used to form a laminated layer. However, 3 or more layers may be used to form a laminated layer. In that case, the total film thickness of the barrier layer non adjacent magnetic layers in the recording layer is set so as to obtain a desirable thermal stability index Δ according to the component size.

Embodiment 3

FIG. 3 shows a basic configuration of Embodiment 3 of the present invention. The configuration of the magnetoresistance effect element includes channel layer (1)/barrier layer non adjacent magnetic layer (2b)/non-magnetic insertion layer (2d)/barrier layer adjacent magnetic layer (2a)/barrier layer (3) sequentially arranged adjacent to one another. The barrier layer non adjacent magnetic layer (2b) non-magnetic insertion layer (2d)/barrier layer adjacent magnetic layer (2a) constitute a recording layer (A1). The details of Embodiment 3 are the same as those of Embodiment 1, except for the following points.

The non-magnetic insertion layer (2d) is inserted for providing the discontinuity of a crystal between the barrier layer adjacent magnetic layer (2a) and the barrier layer non adjacent magnetic layer (2b). For example, when Co is used for the barrier layer non adjacent magnetic layer (2b), and Pt is used for the channel layer (1), Co includes a face-centered cubic lattice or a hexagonal closest packed structure. The (111) plane or (002) plane thereof is oriented in parallel with the film surface. However, in this case, with a general configuration in which MgO and CoFeB are used for the materials of the barrier layer (3) and the barrier layer adjacent magnetic layer (2a), respectively, in order to increase the tunnel magnetoresistance ratio, the (001) plane of the body-centered cubic lattice of CoFeB is required to be oriented in parallel with the film surface, so that the crystallographic symmetry is not aligned. For this reason, in order to provide the discontinuity of a crystal, the non-magnetic insertion layer (2d) is provided. The non-magnetic insertion layer (2d) is preferably Ta, W, Mo, Nb, or the like. Further, even a material having magnetism is usable so long as the discontinuity of a crystal can be provided. For example, an alloy obtained by adding Zr or Ta to Fe, or the like can be used.

The film thickness of the non-magnetic insertion layer (2d) is 0.1 nm to 0.5 nm. When the film thickness of the non-magnetic insertion layer (2d) is larger than 0.5 nm, the magnetic bond between the barrier layer adjacent magnetic layer (2a) and the barrier layer non adjacent magnetic layer (2b) is weakened, resulting in a reduction of the thermal stability.

Further, the interface magnetic anisotropy varies between the barrier layer adjacent magnetic layer (2a) and the barrier layer (3) depending upon the material of the non-magnetic insertion layer (2d), and hence the film thickness of the barrier layer adjacent magnetic layer (2a) is appropriately adjusted so as to be able to absorb the film thickness variation.

Embodiment 4

FIG. 4 shows a basic configuration of Embodiment 4 of the present invention. The configuration of the magnetoresistance effect element includes channel layer (1)/barrier layer non adjacent magnetic layer (2b)/barrier layer adjacent magnetic layer (2a)/barrier layer (3)/reference layer (4) sequentially arranged adjacent to one another. The details of Embodiment 4 are the same as those of Embodiment 1 except for the following points.

The reference layer (4) is used to form a laminated layer so as to be adjacent to the barrier layer (3) on the opposite side thereof to the barrier layer adjacent magnetic layer (2a). The magnetization direction of the reference layer (4) may be substantially fixed in the longitudinal direction of the two-fold symmetric shape.

The bit information is read out based on the magnetization direction of the reference layer (4) substantially fixed in the longitudinal direction, and the magnetization direction of the recording layer (A1) having a component variable and in the direction of the current.

The reference layer (4) has no particular restriction so long as it is a material with the magnetization direction fixed in a longitudinal direction, and preferably includes a material including at least one ferromagnetic transition metal element such as Co, Fe, Ni, or Mn. More preferably, the one obtained by adding an element such as B to the transition metal is used.

Embodiment 5

Figure 5:
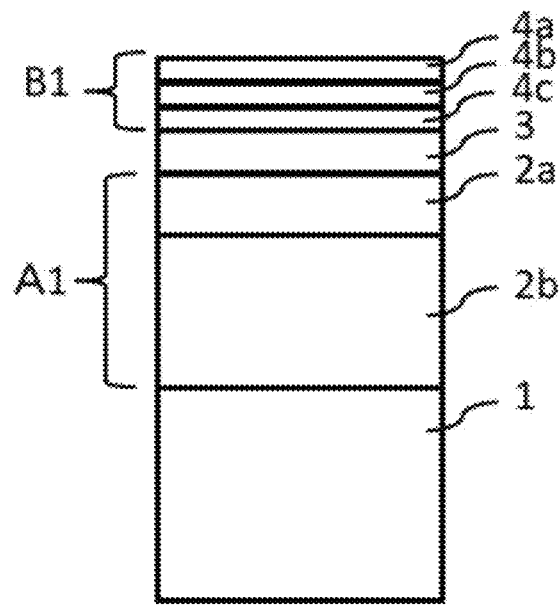
FIG. 5 is a longitudinal section view showing a still further example of the configuration of the magnetoresistance effect element of the present invention.

FIG. 5 shows a basic configuration of Embodiment 5 of the present invention. The configuration of the magnetoresistance effect element includes channel layer (1)/barrier layer non adjacent magnetic layer (2b)/barrier layer adjacent magnetic layer (2a)/barrier layer (3)/ferromagnetic layer (4c)/coupling layer (4b)/ferromagnetic layer (4a) sequentially arranged adjacent to one another. The "ferromagnetic layer (4c)/coupling layer (4b)/ferromagnetic layer (4a)" of the laminated layer ferri structure form the reference layer (B1). The details of Embodiment 5 are the same as those of Embodiment 4, except for the following points.

For the ferromagnetic layer (4a) and the ferromagnetic layer (4c), a material including a ferromagnetic transition metal element such as Fe, Co, or Ni is desirably used. For the coupling layer (4b), a material including Ru, Ir, or the like is desirably used.

The ferromagnetic layer (4a) and the ferromagnetic layer (4c) are magnetically bonded with each other by the coupling layer (4b), thereby stabilizing the magnetization of the reference layer (B1).

Embodiment 6

Figure 6:
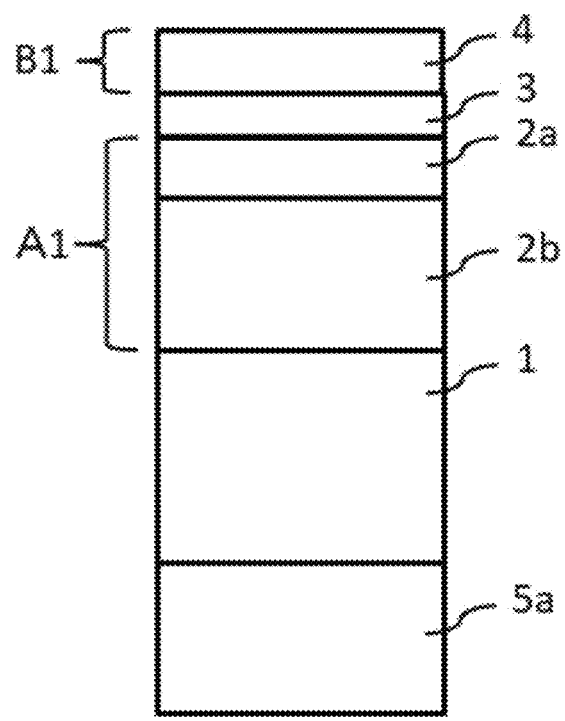
FIG. 6 is a longitudinal section view showing a still furthermore example of the configuration of the magnetoresistance effect element of the present invention.

FIG. 6 shows a basic configuration of Embodiment 6 of the present invention. The configuration of the magnetoresistance effect element includes auxiliary magnetic layer (5a)/channel layer (1)/barrier layer non adjacent magnetic layer (2b)/barrier layer adjacent magnetic layer (2a)/barrier layer (3)/reference layer (4) sequentially arranged adjacent to one another. The details of Embodiment 6 are the same as those of Embodiment 4, except for the following points.

The auxiliary magnetic layer (5a) is disposed adjacent to the channel layer (1) on the opposite side thereof to the recording layer (A1), and has a magnetic field fixed in the Z axial direction. The magnetic field thereof is stably applied to the recording layer (A1). The auxiliary magnetic layer (5a) has no restriction so long as it is a material having a magnetic field fixed in the Z axial direction, for which a material including a ferromagnetic transition metal element such as Fe, Co, or Ni is desirably used. For example, a Co/Pt laminated layer film, a Co/Pd laminated layer film, a Co/Ni laminated layer film, a CoPt alloy film, a CoPd alloy film, a CoNi alloy film, a Co film, and Mn type ordered alloys such as Mn—Al, Mn—Ga, and Mn—Ge, each appropriately adjusted in film formation conditions, composition, and film thickness so as to have perpendicular magnetic anisotropy, and exhibit perpendicular axis of easy magnetization, may become options.

When the magnetoresistance effect element has the auxiliary magnetic layer (5a), the magnetoresistance effect element itself can be applied with a perpendicular magnetic field. This eliminates the necessity of applying an external magnetic field $H_0$ in the write operation.

Embodiment 7

FIG. 7 shows a basic configuration of Embodiment 7 of the present invention. The configuration of the magnetoresistance effect element includes channel layer (1)/barrier layer non adjacent magnetic layer (2b)/barrier layer adjacent magnetic layer (2a)/barrier layer (3)/reference layer (4)/ electrically conducting layer (6)/auxiliary magnetic layer (5b) sequentially arranged adjacent to one another. The details of Embodiment 7 are the same as those of Embodiment 4, except for the following points.

The electrically conducting layer (6) is disposed adjacent to the reference layer (B1) on the opposite side thereof to the barrier layer (3). The auxiliary magnetic layer (5b) is disposed adjacent to the electrically conducting layer (6) on the opposite side thereof to the reference layer (B1). The electrically conducting layer (6) includes a conductive non-magnetic body, and is inserted for preventing the switched connection between the auxiliary magnetic layer (5b) and the reference layer (B1). The auxiliary magnetic layer (5b) has a magnetic field fixed in the Z axial direction. The magnetic field is stably applied to the recording layer (A1). The auxiliary magnetic layer (5b) has no restriction so long as it is a material having a magnetic field fixed in the Z axial direction, for which a material including a ferromagnetic transition metal element such as Fe, Co, or Ni is desirably used.

When the magnetoresistance effect element includes the auxiliary magnetic layer (5b), the magnetoresistance effect element itself can be applied with a perpendicular magnetic field. This eliminates a necessity of applying an external magnetic field $H_0$ in the write operation.

Embodiment 8

Figure 8B:
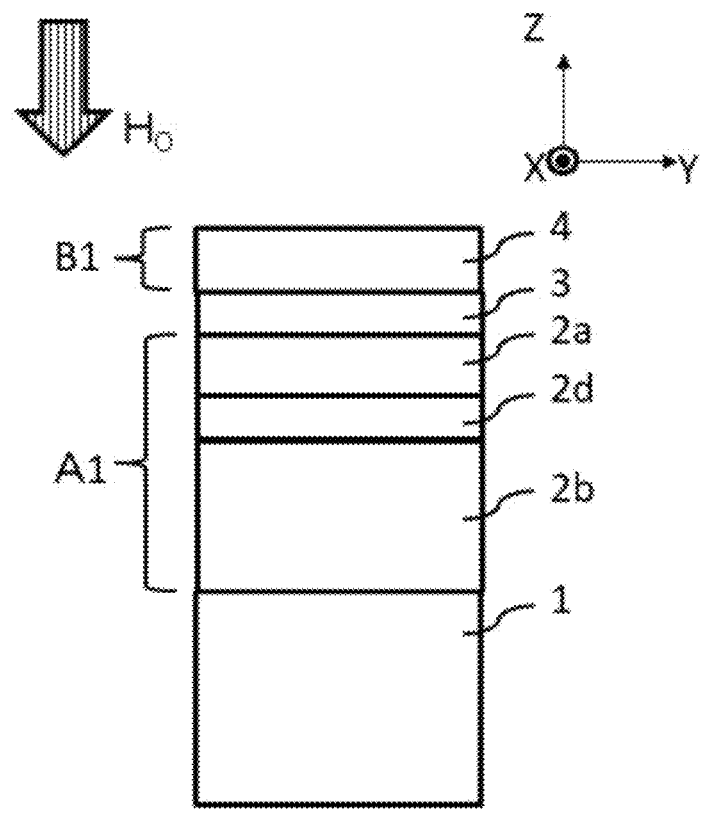
FIG. 8B is a side view showing an embodiment of the magnetoresistance effect element of the present invention.
Figure 8C:
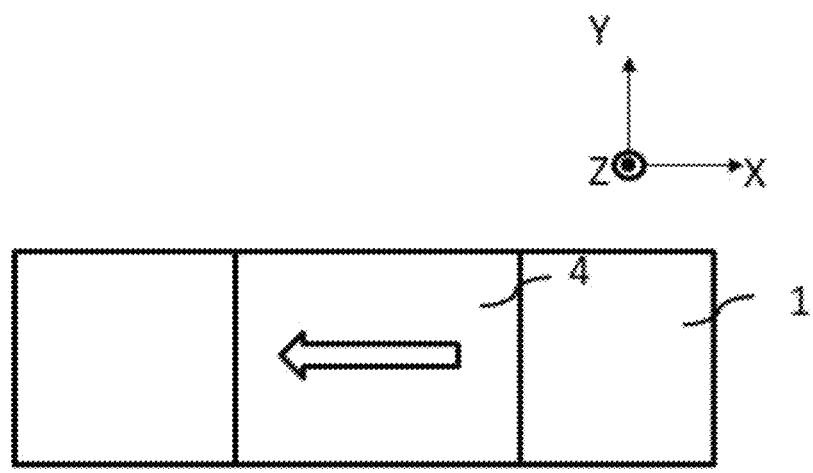
FIG. 8C is a top view showing an embodiment of the magnetoresistance effect element of the present invention.

FIGS. 8A, 8B, and 8C show, as Embodiment 8, a front view, a side view, and a top view of a magnetoresistance effect element including both the elements of Embodiment 3 including the non-magnetic insertion layer (2d), and Embodiment 4 including the reference layer (4) when the shape of the channel layer (1) is set as a planar shape extended in the direction of the writing current $I_C$ (X axial direction).

Examples of respective layers in FIGS. 8A, 8B, and 8C are: channel layer (1): Pt (film thickness 5 nm), barrier layer non adjacent magnetic layer (2b): Co (film thickness 2.1 nm), non-magnetic insertion layer (2d): Ta (film thickness 0.2 nm), barrier layer adjacent magnetic layer (2a): CoFeB (film thickness 1.4 nm), barrier layer (3): MgO (film thickness 1.4 nm), and reference layer (4): CoFeB (film thickness 2.0 nm).

FIGS. 8A and 8B each show an example in which the recording layer (A1) of the magnetoresistance effect element is applied with an external magnetic field $H_0$ in the Z axial direction, and is applied with a longitudinal effective field. When the auxiliary magnetic layer (5a or 5b) is included therein as described previously, or when the axis of easy magnetization of the recording layer (A1) includes a Y axis component, the external magnetic field $H_0$ is not required to be applied.

When the external magnetic field $H_0$ is applied, the intensity of the external magnetic field $H_0$ is about 1 mT to 500 mT, and more desirably about 5 mT to 200 mT.

Figure 8D:
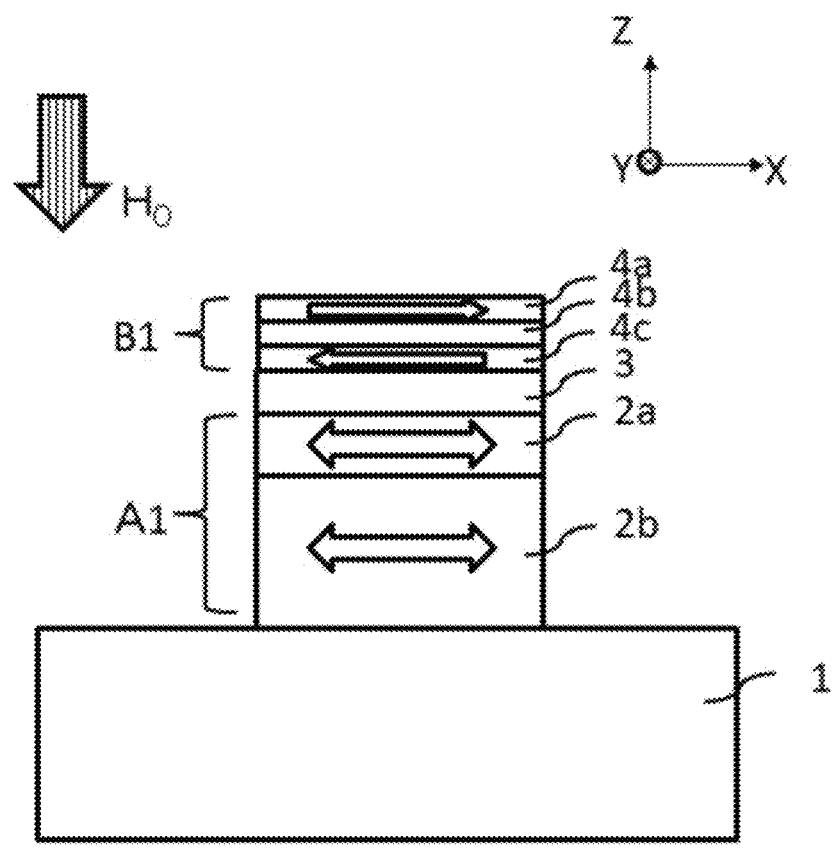
FIG. 8D is a front view showing an embodiment of the magnetoresistance effect element of the present invention.
Figure 8E:
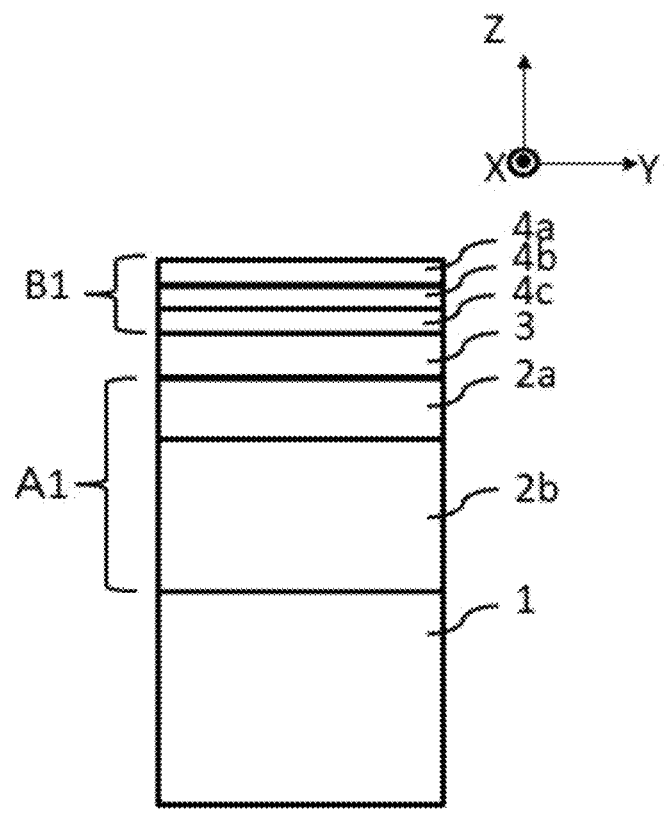
FIG. 8E is a side view showing an embodiment of the magnetoresistance effect element of the present invention.
Figure 8F:
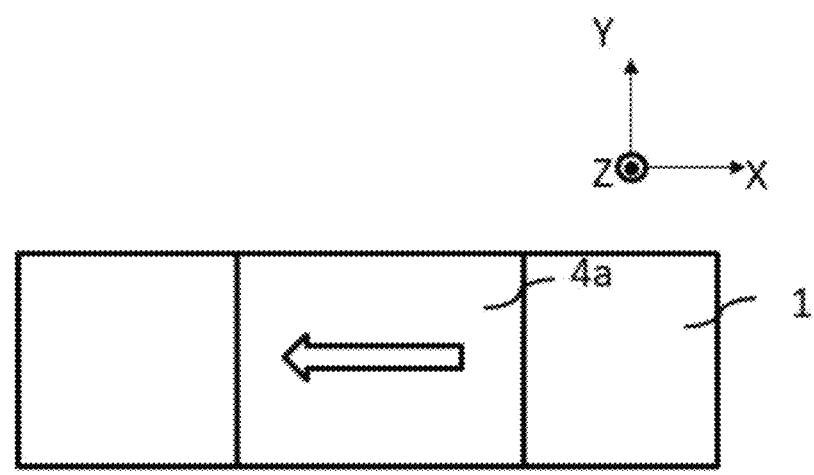
FIG. 8F is a top view showing an embodiment of the magnetoresistance effect element of the present invention.

Further, FIGS. 8D, 8E, and 8F show a front view, a side view, and a top view of the magnetoresistance effect element when the shape of the channel layer (1) of Embodiment 5 including the reference layer (B1) of a laminated layer ferri structure is set as a planar shape extended in the direction of the writing current $I_C$ (X axial direction).

Figure 8G:
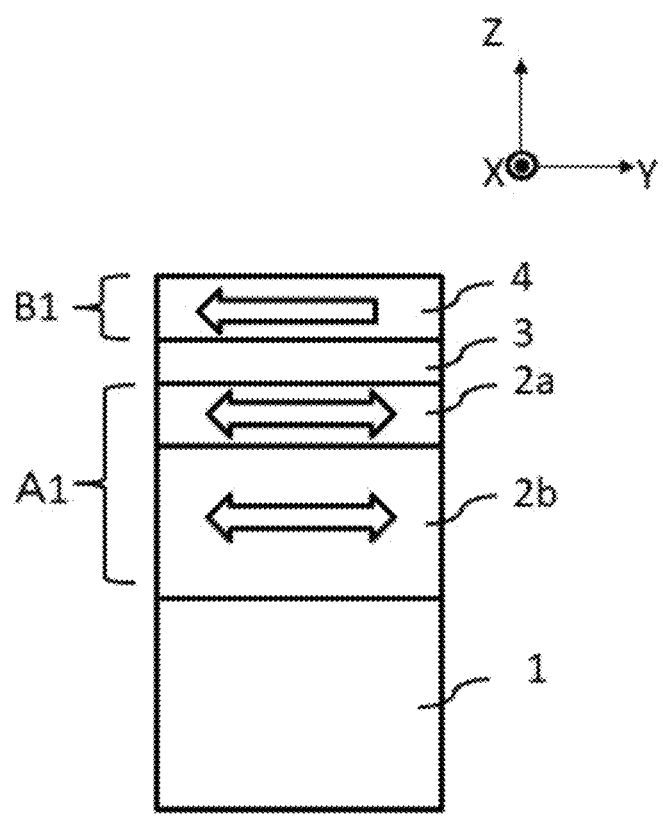
FIG. 8G is a side view showing an embodiment of the magnetoresistance effect element of the present invention.
Figure 8H:
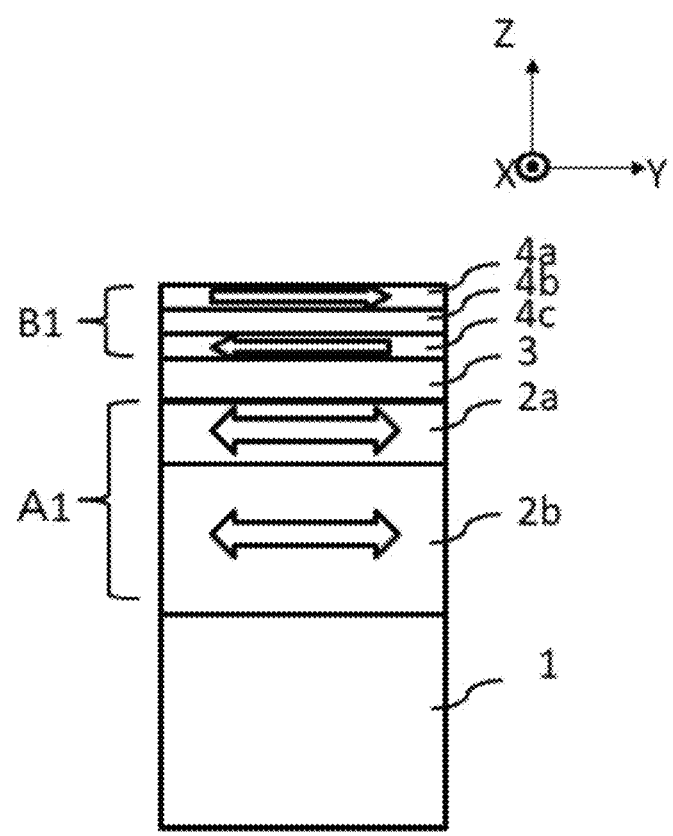
FIG. 8H is a side view showing an embodiment of the magnetoresistance effect element of the present invention.

FIGS. 8G and 8H each show a side view of the magnetoresistance effect element (Y type) when a current is introduced in the X axial direction to the channel layer (1), and the magnetization direction is the Y axial direction.

Embodiment 9

FIGS. 9A to 9D show states before and after writing data "1", and states before and after writing data "0" in the magnetoresistance effect element of Embodiment 8, respectively, as Embodiment 9.

FIG. 9A shows a state of the magnetoresistance effect element with data "0" recorded thereon. When a pulse-shaped writing current $I_C$ is introduced to the channel layer (1) in the −X axial direction with the magnetization direction of the recording layer (A1) being the −X axial direction, and the external magnetic field $H_0$ applied in the −Z axial direction, a spin current Js is generated in the +Z axial direction due to the spin Hall effect which the heavy metal forming the channel layer (1) has, or the like. The spin current Js including spins unevenly distributed therein causes a spin orbital torque to act on the recording layer (A1). As a result, as shown in FIG. 9B, the magnetization direction of the recording layer (A1) is made reversal, so that data "1" is written thereon.

FIG. 9C shows a state of the magnetoresistance effect element with data "1" recorded thereon. When a pulse-shaped writing current $I_C$ is introduced to the channel layer (1) in the X axial direction with the magnetization direction of the recording layer (A1) being the +X axial direction, and the external magnetic field $H_0$ applied in the −Z axial direction, a spin current Js is generated in the −Z axial direction due to the spin Hall effect which the heavy metal forming the channel layer (1) has, or the like. The spin current Js including spins unevenly distributed therein causes a spin orbital torque to act on the recording layer (A1). As a result, as shown in FIG. 9D, the magnetization direction of the recording layer (A1) is made reversal, so that data "0" is written thereon.

The pulse width of the writing current $I_C$ is set equal to, or larger than the time required for writing, and varies according to the conditions such as composition and the film thickness of each layer, the current value, and the intensity of the magnetic field to be subjected to application. Specific examples thereof are less than 30 nanoseconds, for example, 0.1 nanosecond to 10 nanoseconds, and more preferably 0.3 nanosecond to 10 nanoseconds.

In FIG. 9A of Embodiment 9, it is configured such that, the magnetization direction of the recording layer (A1) is the −X axial direction; the external magnetic field $H_0$, the −Z axial direction; and the writing current $I_C$, the −X axial direction. However, for example, the relationship between the external magnetic field $H_0$ and the current direction may be reversed. The directions are appropriately determined depending upon the signs of the spin Hall angle of the material for causing a spin current. Further, the case where the magnetization direction of the recording layer (A1) is the −X axial direction was assumed to be data "0", and the case of X axial direction was assumed to be data "1". However, the opposite is also acceptable.

Embodiment 10

Figure 10:
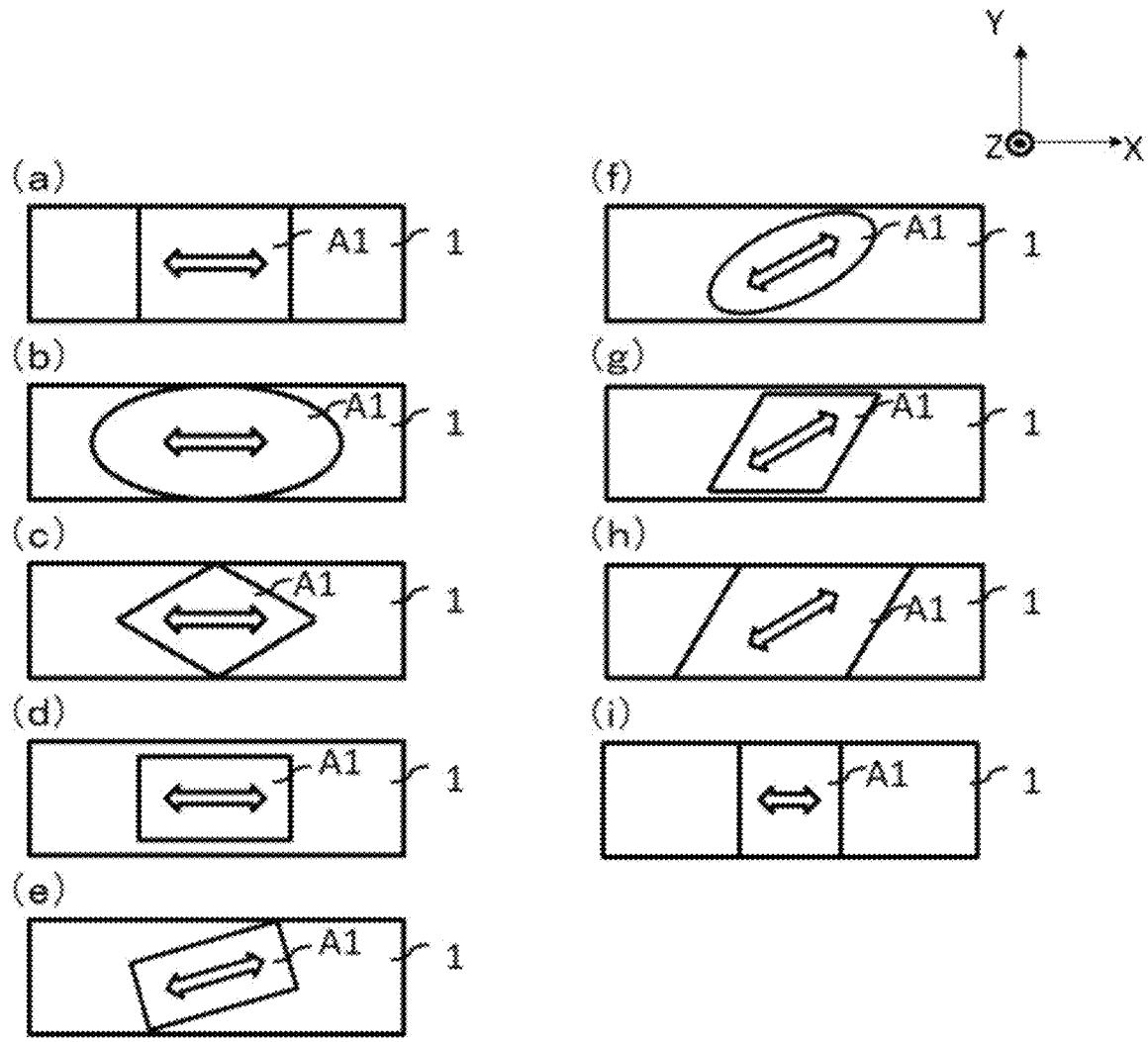
FIG. 10 shows an example of a shape of a recording layer having a two-fold symmetry, and an example of a top view of a channel layer.

FIG. 10 shows Embodiment 10 of the shape of the recording layer (A1).

Any in-plane axis of easy magnetization of the recording layer (A1) is acceptable so long as it has an X axial component on which a spin orbital torque acts by the writing current $I_C$ to the channel layer (1). For this reason, the direction of the in-plane axis of easy magnetization of the recording layer (A1) is not required to be strictly the X axial direction, and the shape thereof is also arbitrary. However, the recording layer (A1) desirably has substantially two-fold symmetry within the range of ununiformity in the plane (in the layer, in the X-Y axial direction) of the recording layer (A1).

Embodiment 11

Figure 11:
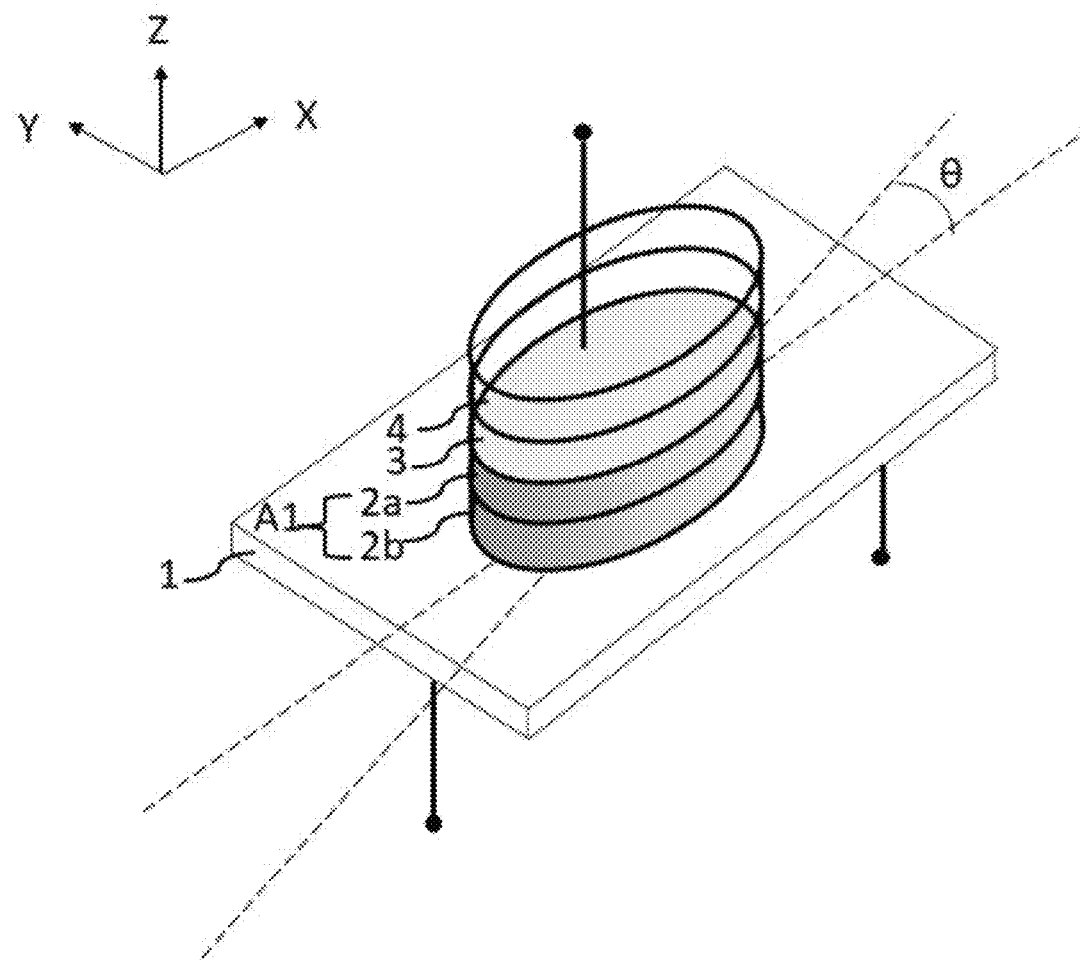
FIG. 11 is a view showing one example of a structure of a magnetoresistance effect element formed with the axis of easy magnetization of the recording layer at an angle relative to the direction of the current to be introduced to the channel layer.

FIG. 11 shows Embodiment 11 in which the axis of easy magnetization of the recording layer (A1) is not strictly in the X axial direction, and has an X axial component.

The planar shape of the channel layer (1) is a rectangle, the planar shapes of the recording layer (A1), the barrier layer (3), and the reference layer (4) are each an ellipse, and the axis of easy magnetization of the recording layer is arranged at an angle θ in the X-Y axial direction with respect to the direction of the current of the channel layer (1) (X axial direction).

The axis of easy magnetization of the recording layer (A1) has an X axial component and a Y axial component. By allowing the axis of easy magnetization to have a Y axial component, the magnetization direction of the recording layer (A1) can be made reversal even if the magnetic field in the Z axial direction by the external magnetic field $H_0$ or the auxiliary magnetic layers (5a and 5b) is not subjected for application.

The angle θ is set so as to be ±3° to ±45°, and preferably ±3° to ±25° when the X axial direction is assumed to be 0°.

Note that the angle θ is a preferable value when the external magnetic field $H_0$ or the magnetic field in the Z axial direction by the auxiliary magnetic layers (5a and 5b) is not applied. When the magnetic field in the Z axial direction is separately applied, for example, the write operation also becomes possible within the range of 0° to ±3°.

Embodiment 12

Figure 12A:
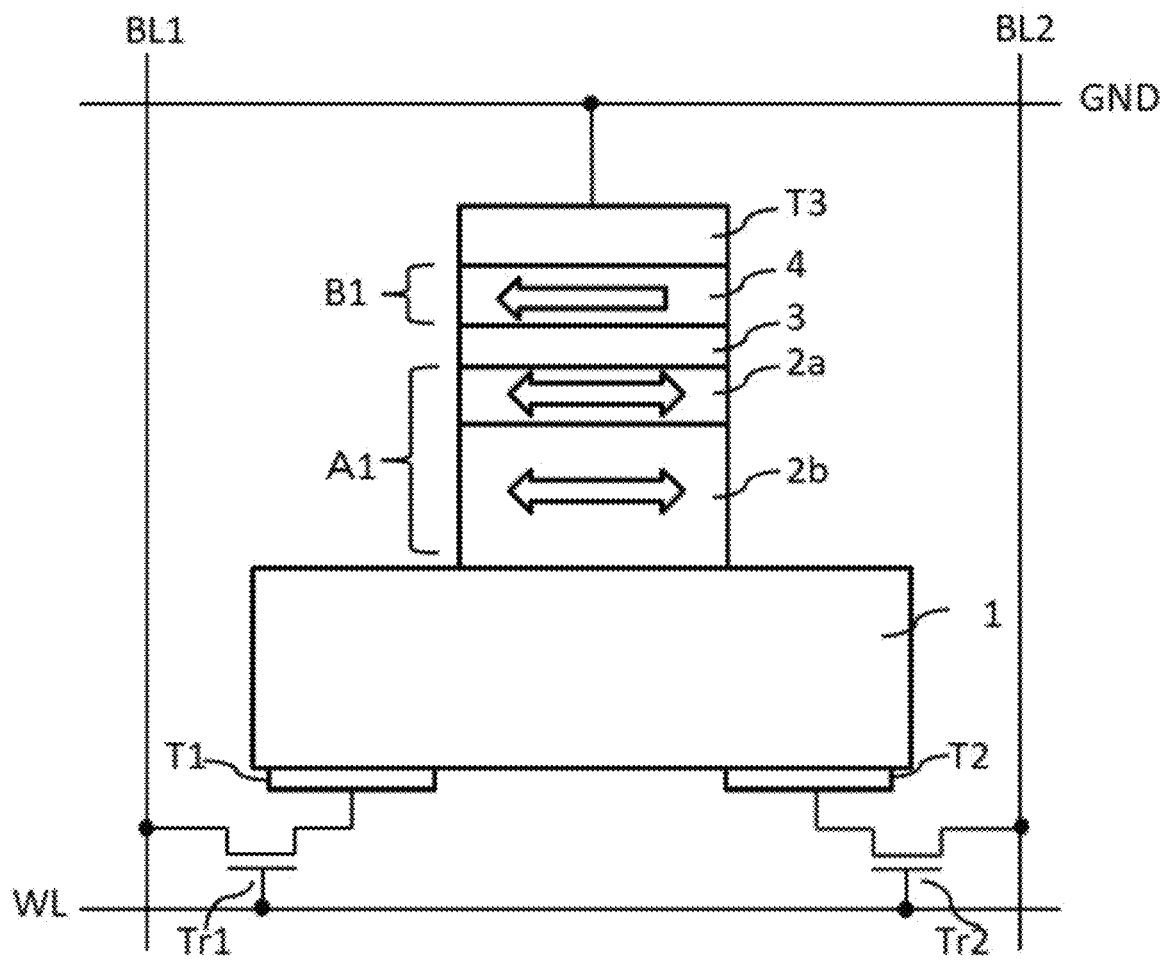
FIG. 12A shows one example of a circuit configuration of a 1-bit memory cell using the magnetoresistance effect element of the present invention.

FIG. 12A shows a circuit configuration of a magnetic memory cell for 1 bit as one example of Embodiment 12. The magnetic memory cell circuit for 1 bit includes the magnetoresistance effect element shown in Embodiment 8, a first bit line (BL1), a second bit line (BL2), a word line (WL), a ground line (GND), a first transistor (Tr1), a second transistor (Tr2), a first terminal (T1), a second terminal (T2), and a third terminal (T3).

When data is written to the magnetic memory cell circuit, a difference is caused in level setting between the first bit line (BL1) and the second bit line (BL2). As a result, the writing current $I_C$ is introduced to the channel layer (1), and the magnetization direction of the recording layer (A1) is made reversal, so that data is written.

When data is read out from the magnetic memory cell circuit, the word line (WL) is set to an active level. Then, the first transistor (Tr1) and the second transistor (Tr2) are turned ON, and both of the first bit line (BL1) and the second bit line (BL2) are set to High level, or one of them is set to High level and the other is opened. As a result, a readout current passes from channel layer (1) through recording layer (A1), barrier layer (3), reference layer (B1), third terminal (T3), to ground line (GND), so that the recorded data is read out from the resistance value of the path.

FIG. 12B shows another example of Embodiment 12. All of the first terminal (T1) to be connected to one end of the channel layer (1), the second terminal (T2) to be connected to the other end, and the third terminal (T3) to be connected to the reference layer (B1) are disposed on the substrate side. The disposition of all the terminals on the substrate side eliminates the necessity of wiring at the top of the magnetoresistance effect element, which can reduce the cell size.

FIG. 12C shows a still other example of Embodiment 12. The first terminal (T1) and the second terminal (T2) are disposed on the opposite side of the substrate, and the third terminal (T3) is disposed on the substrate side. When an input signal is fed from the top of the magnetoresistance effect element, the efficient layout is possible.

The magnetic memory cell circuit configuration of Embodiment 12 is one example, and may only be a circuit configuration such that the writing current $I_C$ is introduced to the channel layer for writing, and the magnetic resistance of the recording layer (A1) and the reference layer (B1) interposing the barrier layer (3) therebetween can be read.

Embodiment 13

Figure 13:
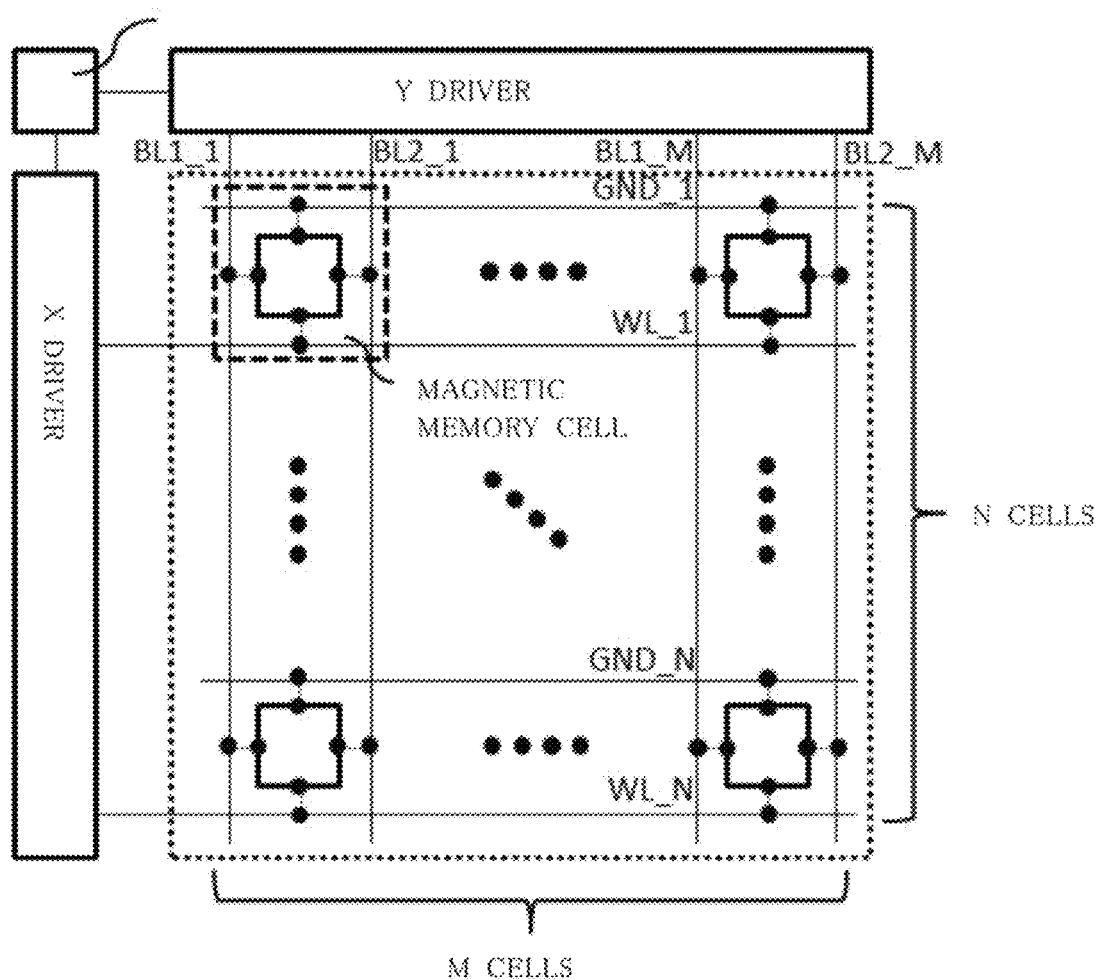
FIG. 13 is one example of a block view of a magnetic memory including a plurality of magnetoresistance effect elements of the present invention arranged therein.

FIG. 13 shows a magnetic memory including a plurality of the magnetic memory cells of Embodiment 12 as Embodiment 13.

The magnetic memory include a memory cell array, an X driver, a Y driver, and a controller. The memory cell array has magnetic memory cells arranged in an array. The X driver is connected to a plurality of word lines (WL), and the Y driver is connected to a plurality of bit lines (BL), and function as a readout means and a writing means.

Embodiment 14

FIG. 14 shows data on the thermal stability and the writing current of Embodiment 14 as comparison with a conventional example. (a) is a view showing a configuration of a magnetoresistance effect element of the conventional example, (b) is a view showing a configuration of Embodiment 14, (c) is a graph showing the relationship between the total of the film thicknesses of the magnetic layers in the recording layer and the saturation magnetization, and (d) is a graph showing the relationship between the total of the film thicknesses of the magnetic layers in the recording layer and the effective diamagnetic field in the direction perpendicular to a film surface.

The basic configuration of the magnetoresistance effect element of the conventional example is channel layer (1): Ta, barrier layer adjacent magnetic layer (2a): CoFeB, and barrier layer (3): MgO.

On the other hand, the configuration of the magnetoresistance effect element of Embodiment 14 is channel layer (1): Pt (5 nm), barrier layer non adjacent magnetic layer (2b): Co (2.1 nm), non-magnetic insertion layer (2d): Ta (0.2 nm), barrier layer adjacent magnetic layer (2a): CoFeB (1.4 nm), and barrier layer (3): MgO. Herein, in Embodiment 14, the effective film thickness of the Co layer is reduced by about 0.7 nm due to mutual diffusion with Ta of the non-magnetic insertion layer (2d).

The graph shown in (c) shows each saturation magnetization Ms (T) determined from the magnetization curves of the magnetoresistance effect elements when the film thickness $t_{FM}$ of CoFeB is set at 1.4 nm to 2.5 nm in the basic configuration of the magnetoresistance effect element of the conventional example, and Embodiment 14.

When the film thickness of CoFeB increases in the conventional example, the saturation magnetization Ms shows roughly a constant value, and the value is about 1.5 T. When a material of an in-plane easy axis is used, the thermal stability index Δ is proportional to the square of the saturation magnetization and the film thickness of the magnetic layer. For this reason, when the film thickness of CoFeB increases, the thermal stability also increases.

On the other hand, in Embodiment 14, CoFeB has a film thickness of 1.4 nm, and the total of the effective film thicknesses of the magnetic layers in the recording layer is 2.9 nm. In this system, the saturation magnetization Ms was about 1.7 T. As compared with the film thickness (1.4 nm) of CoFeB, the saturation magnetization Ms is about 1.13 times that of the conventional example. It is considered that the thermal stability also increases to about 1.3 times when comparison is made with the conventional example of the same film thickness.

Accordingly, it is indicated as follows: even when the film thickness of CoFeB of the barrier layer adjacent magnetic layer (2a) is minimized at 1.4 nm so as to cause the in-plane easy axis in Embodiment 14, it is possible to obtain the thermal stability about 1.3 times larger than that of the one obtained by increasing the film thickness of CoFeB by inserting the barrier layer non adjacent magnetic layer (2b).

Further, (d) is the graph showing the product $\mu_0 H_K^{eff}$ (T) of the effective diamagnetic field $H_K^{eff}$ in a direction perpendicular to a film surface and the space permeability $\mu_0$ determined from the magnetization curve of the recording layer of each magnetoresistance effect element when the film thickness $t_{FM}$ of CoFeB is set at 1.4 nm to 2.5 nm in the basic configuration of the magnetoresistance effect element of the conventional example, and Embodiment 14.

It is indicated that when the film thickness of CoFeB increases in the conventional example, the product $\mu_0 H_K^{eff}$ (T) of the effective diamagnetic field $H_K^{eff}$ in a direction perpendicular to a film surface and the space permeability $\mu_0$ decreases, and the absolute value increases. The absolute value of the effective diamagnetic field $H_K^{eff}$ in a direction perpendicular to a film surface and the value of the writing current $I_C$ have positive correlation. For this reason, an increase in film thickness of CoFeB also results in an increase in writing current $I_C$.

On the other hand, in Embodiment 14, even when the total of the film thicknesses of the effective magnetic layers in the recording layer becomes 2.9 nm, the absolute value of the product $\mu_0 H_K^{eff}$ (T) of the effective diamagnetic field $H_K^{eff}$ in a direction perpendicular to a film surface and the space permeability $\mu_0$ becomes about 150 mT, and is roughly equal to the value (about 100 mT) when the film thickness of CoFeB of the conventional example is 1.4 nm to 1.6 nm.

Accordingly, conceivably, even when the barrier layer non adjacent magnetic layer (2b) is inserted to the barrier layer adjacent magnetic layer (2a) of CoFeB, and the total of the film thicknesses of the magnetic layers increases to 2.9 nm in Embodiment 14, the operation is possible at an about 80% lower writing current as compared with the case where the film thickness of CoFeB is set at 2.9 nm in the conventional example.

From the description up to this point, the magnetoresistance effect element of Embodiment 14 combines both characteristics of a higher thermal stability index Δ and a lower writing current $I_C$ as compared with the conventional example.

Note that the layer configuration shown in each embodiment may only include layers arranged sequentially adjacent to one another, and has no restriction on the method of deposition to form a laminated layer, the order of deposition for forming laminated layer, the vertical and horizontal orientations, and the like.

REFERENCE SIGNS LIST

1 Channel layer
2a Barrier layer adjacent magnetic layer
2b Barrier layer non adjacent magnetic layer
2c Additional barrier layer non adjacent magnetic layer
2d Non-magnetic insertion layer
3 Barrier layer
4 Reference layer
4a, 4c Ferromagnetic layer
4b Coupling layer
5a, 5b Auxiliary magnetic layer
6 Electrically conducting layer
A1 Recording layer
B1 Reference layer
BL1 First bit line
BL2 Second bit line
GND Ground line
T1 First terminal
T2 Second terminal
T3 Third terminal
Tr1 First transistor
Tr2 Second transistor
WL Word line

The invention claimed is:
1. A magnetoresistance effect element, comprising:
a channel layer,
a recording layer disposed adjacent to said channel layer, and including a ferromagnetic substance, and
a barrier layer disposed adjacent to said recording layer on an opposite side thereof to said channel layer, and constituted by an insulator,
wherein said recording layer has at least two or more magnetic layers including films having different magnetic characteristics,
wherein said two or more magnetic layers consist of one barrier-layer-adjacent-magnetic-layer disposed adjacent to said barrier layer, and one or more barrier-layer-non-adjacent-magnetic-layers that are not adjacent to said barrier layer,
wherein the barrier-layer-adjacent-magnetic-layer and the barrier-layer-non-adjacent-magnetic-layers are magnetically bonded, and a magnetization direction of both of said barrier-layer-adjacent-magnetic-layer and said barrier-layer-non-adjacent-magnetic-layers is in parallel with a film surface, is variable, and is made reversal in a same direction, wherein a current in a direction substantially in parallel with said recording layer is introduced to said channel layer, thereby making a magnetization direction of said recording layer reversal, wherein said barrier-layer-non-adjacent-magnetic-layer is constituted by a magnetic material film made of a Co film serving as an in-plane axis of easy magnetization, and wherein an axis of easy magnetization of said recording layer is in a direction at within ±45° with respect to a direction of said current.

2. The magnetoresistance effect element according to claim 1, wherein said barrier-layer-adjacent-magnetic-layer includes at least Fe, and said barrier layer includes at least O.

3. The magnetoresistance effect element according to claim 1, wherein a non-magnetic insertion layer is inserted between said two or more magnetic layers forming said recording layer.

4. The magnetoresistance effect element according to claim 1, wherein said channel layer has a heavy metal.

5. The magnetoresistance effect element according to claim 1, wherein a longitudinal effective field to be applied to said recording layer from a direction perpendicular to a film surface of said channel layer due to introduction of a current to said channel layer makes the magnetization direction of said recording layer reversal.

6. The magnetoresistance effect element according to claim 1, wherein said channel layer has a shape extended in the direction of said current to be introduced, and said recording layer has substantially a two-fold symmetric shape in a recording layer plane, and a longitudinal direction has a component in the direction of said current.

7. The magnetoresistance effect element according to claim 1, wherein a pulse width of the current to be introduced to said channel layer is 0.3 to 10 nanoseconds.

8. A magnetic memory comprising the magnetoresistance effect element according to claim 1.

9. A magnetoresistance effect element, comprising:

a channel layer, a recording layer disposed adjacent to said channel layer, and including a ferromagnetic, and a barrier layer disposed adjacent to said recording layer on an opposite side thereof to said channel layer, and including an insulator, wherein said recording layer has at least two or more magnetic layers including films having different magnetic characteristics, wherein said two or more magnetic layers consists of one barrier-layer-adjacent-magnetic-layer disposed adjacent to said barrier layer, and one or more barrier-layer-non-adjacent-magnetic-layers not adjacent to said barrier layer, wherein the barrier-layer-adjacent-magnetic-layer and the barrier-layer-non-adjacent-magnetic-layers are magnetically bonded, and a magnetization direction of both of said barrier-layer-adjacent-magnetic-layer and said barrier-layer-non-adjacent-magnetic-layers is in parallel with a film surface, is variable, and is made reversal in a same direction, wherein a current in a direction substantially in parallel with said recording layer is introduced to said channel layer, thereby making a magnetization direction of said recording layer reversal, wherein said at least one or more barrier-layer-non-adjacent-magnetic-layers is constituted by a magnetic material film made of a Co film serving as an in-plane axis of easy magnetization, and wherein an axis of easy magnetization of said recording layer is in a direction at within ±45° with respect to a direction of said current.

* * * * *